United States Patent
Hoshi et al.

(10) Patent No.: US 10,658,465 B2
(45) Date of Patent: May 19, 2020

(54) SILICON CARBIDE SEMICONDUCTOR DEVICE AND METHOD OF MANUFACTURING A SILICON CARBIDE SEMICONDUCTOR DEVICE

(71) Applicant: FUJI ELECTRIC CO., LTD., Kawasaki-shi, Kanagawa (JP)

(72) Inventors: Yasuyuki Hoshi, Matsumoto (JP); Yuichi Hashizume, Matsumoto (JP); Keishirou Kumada, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 16/022,606

(22) Filed: Jun. 28, 2018

(65) Prior Publication Data
US 2019/0043957 A1 Feb. 7, 2019

(30) Foreign Application Priority Data

Aug. 4, 2017 (JP) .................. 2017-152024

(51) Int. Cl.
| H01L 29/16 | (2006.01) |
| H01L 29/10 | (2006.01) |
| H01L 29/06 | (2006.01) |
| H01L 29/78 | (2006.01) |
| H01L 29/66 | (2006.01) |

(52) U.S. Cl.
CPC ...... *H01L 29/1608* (2013.01); *H01L 29/0615* (2013.01); *H01L 29/0619* (2013.01); *H01L 29/0661* (2013.01); *H01L 29/1095* (2013.01); *H01L 29/66068* (2013.01); *H01L 29/7811* (2013.01); *H01L 29/7813* (2013.01); *H01L 29/0638* (2013.01)

(58) Field of Classification Search
CPC ................. H01L 29/1608; H01L 29/0684
See application file for complete search history.

(56) References Cited

U.S. PATENT DOCUMENTS

2016/0013137 A1 1/2016 Hiyoshi et al.
2017/0313065 A1* 11/2017 Schulte ............... B41J 2/17553

FOREIGN PATENT DOCUMENTS

| JP | 2009-123914 A | 6/2009 |
| JP | 2016-018952 A | 2/2016 |
| JP | 2017-022422 A | 1/2017 |

* cited by examiner

*Primary Examiner* — Quoc D Hoang
(74) *Attorney, Agent, or Firm* — Rabin & Berdo, P.C.

(57) ABSTRACT

A silicon carbide semiconductor device includes a semiconductor substrate of a first conductivity type; an active region in which a main current flows provided on the semiconductor substrate; a termination region disposed outside of the active region and in which a voltage withstanding structure is formed; and a damaged region disposed outside the termination region and in which crystallinity is impaired, the damaged region being exposed at a cut surface that is formed when singulation is performed.

5 Claims, 16 Drawing Sheets

SILICON CARBIDE SEMICONDUCTOR DEVICE AND METHOD OF MANUFACTURING A SILICON CARBIDE SEMICONDUCTOR DEVICE

CROSS REFERENCE TO RELATED APPLICATION

This application is based upon and claims the benefit of priority of the prior Japanese Patent Application No. 2017-152024, filed on Aug. 4, 2017, the entire contents of which are incorporated herein by reference.

BACKGROUND OF THE INVENTION

1. Field of the Invention

Embodiments of the present invention relate to a silicon carbide semiconductor device and method of manufacturing a silicon carbide semiconductor device.

2. Description of the Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for a large-current, high-speed power semiconductor device. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling production (manufacture) of a next-generation power semiconductor device having low ON voltage, high-speed characteristics, and high-temperature characteristics.

One factor is that SiC is chemically a very stable semiconductor material, has a wide bandgap of 3 eV, and can be used very stably as a semiconductor even at high temperatures. Further, SiC has a critical electric field strength that is ten times that of silicon or greater. SiC is highly likely to exceed the theoretical material limit of silicon and therefore, expanded use in power semiconductor applications, especially, in MOSFETs, is highly expected. In particular, while a low ON resistance in such applications is expected, a vertical SiC-MOSFET that maintains high voltage characteristics and has an even lower ON resistance can be expected.

FIG. 16 is a top view of silicon carbide semiconductor elements on a silicon carbide semiconductor wafer. A silicon carbide semiconductor device is manufactured by cutting out (dicing) a silicon carbide semiconductor element (silicon carbide semiconductor chip) 3100 formed on a silicon carbide semiconductor wafer 3110, into an individual chip (singulation). When the silicon carbide semiconductor wafer 3110 is diced, for example, parts indicated by dashed lines in FIG. 16 are cut by laser, ultrasound, or a dicing blade, which is a circular rotary blade made of diamond.

There are techniques to suppress an occurrence of cracks in the silicon carbide semiconductor element 3100 when the silicon carbide semiconductor element 3100 is cut from the silicon carbide semiconductor wafer 3110. For example, a known semiconductor device includes a semiconductor layer having an element region and an outer peripheral region surrounding an outer periphery of the element region; a step part formed in the outer peripheral region and surrounding the outer periphery of the element region; and a metal layer formed along the step part (for example, refer to Japanese Laid-Open Patent Publication No. 2016-18952). The step part of the semiconductor device has a side wall that is recessed below a main surface of the element region and the metal layer of the semiconductor device extends to at least partially cover the side wall. In a method of manufacturing the semiconductor device, beyond the step part in the outer peripheral region, the semiconductor layer is divided for each element region, whereby the occurrence of chipping and cracks, which damage the element region, are suppressed.

According to another known technique, when a SiC substrate is scribed in a vertical direction against a crystal axis of the SiC substrate, left and right cutting edge angles with respect to a ridgeline of a cutting edge are made different, and the SiC substrate is scribed by using a scribing wheel by which a cutting edge angle located at a higher position as viewed from the crystal axis is made large and other cutting edge angles are made small (for example, refer to Japanese Laid-Open Patent Publication No. 2017-22422). As a result, an occurrence of horizontal cracks may be avoided and end surface precision at the time of breaking may be improved.

SUMMARY OF THE INVENTION

According to an embodiment of the invention, a silicon carbide semiconductor device includes an active region in which a main current flows, the active region being provided on a semiconductor substrate of a first conductivity type; a termination region disposed outside the active region and in which a voltage withstanding structure is formed; and a damaged region disposed outside the termination region and in which crystallinity is impaired, the damaged region being exposed at a cut surface that is formed when singulation is performed.

In the embodiment, the damaged region is a region in which crystal defects are formed.

In the embodiment, the damaged region has an impurity concentration that is higher than an impurity concentration of a semiconductor region provided in the active region.

In the embodiment, the impurity concentration of the damaged region is in a range from $1 \times 10^{19}/cm^3$ to $1 \times 10^{20}/cm^3$.

In the embodiment, the semiconductor substrate comprises an epitaxial layer and a base substrate, the epitaxial layer having first and second sides, the second side is opposite to the first side and in contact with the base substrate; and the damaged region is provided in contact with the first side in the epitaxial layer, and a density of the crystal defects in the damaged region being higher with proximity to the first side.

According to another embodiment of the invention, a method of manufacturing a silicon carbide semiconductor device having an active region in which a main current flows, the active region being provided on a semiconductor substrate of a first conductivity type, and a termination region disposed outside the active region and in which a voltage withstanding structure is formed, includes forming a silicon carbide semiconductor element on the semiconductor substrate; forming a damaged region in which crystallinity is impaired, the damaged region being formed outside the termination region; and cutting the damaged region to cut the silicon carbide semiconductor element from the semiconductor substrate.

In the embodiment, forming the damaged region includes forming the damaged region by ion implantation or laser irradiation.

Objects, features, and advantages of the present invention are specifically set forth in or will become apparent from the following detailed description of the invention when read in conjunction with the accompanying drawings.

DETAILED DESCRIPTION OF THE INVENTION

First problems associated with the related arts will be discussed. A wide bandgap semiconductor substrate (for example, silicon carbide substrate) is harder than a silicon substrate and thus, distortion in a cut surface often occurs during dicing. Distortion includes cracks (scratches) and splinters that occur in the substrate. For example, during dicing, distortion occurs due to the surface that is to be cut by the dicing blade being slanted. Further, due to the hardness being high, the life of the dicing blade is short and due to degradation of the rotary blade, deformation occurs.

Figure 17:
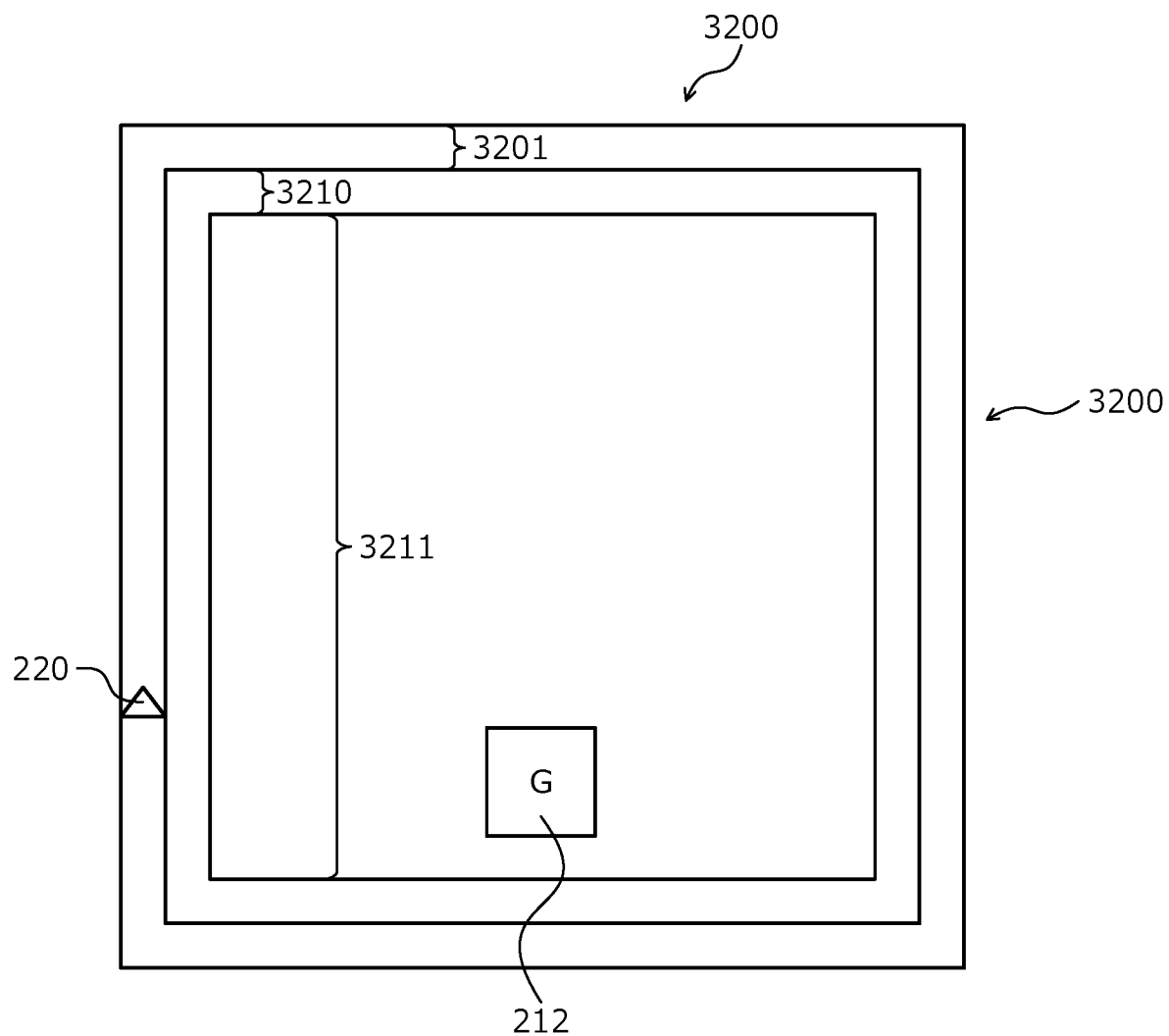
FIG. 17 is a top view of a singulated silicon carbide semiconductor element.

FIG. 17 is a top view of a singulated silicon carbide semiconductor element. In the silicon carbide semiconductor element, in an outer periphery of an active region 3211 in which a main current flows, an edge termination region 3210 that surrounds a periphery of the active region 211 and sustains breakdown voltage is provided, and outside the edge termination region 3210, an inactive region 3201 is provided. In the inactive region 3201, the silicon carbide semiconductor wafer 3110 is diced, and a singulation cut surface 3200 appears. Further, in the active region 3211, a gate pad region 212 is provided. In the inactive region 3201, distortion 220 on a front surface side is depicted as an example of distortion.

Figure 18:
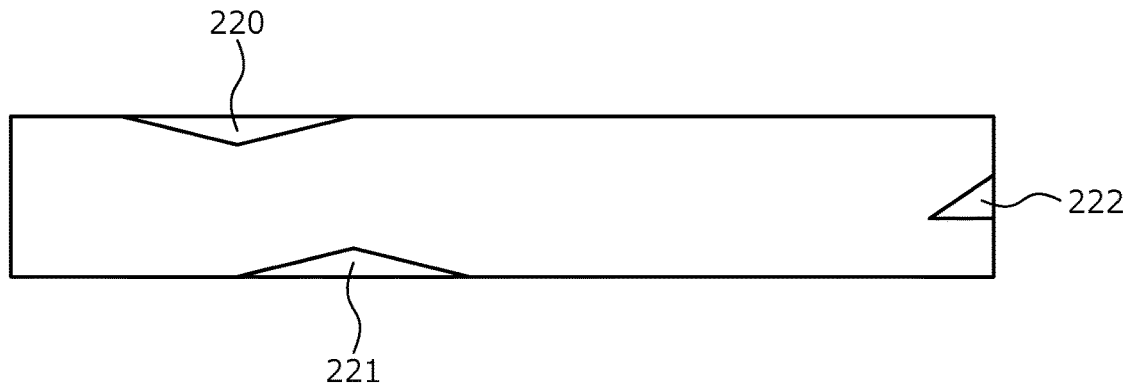
FIG. 18 is a side view of an example of distortion of a silicon carbide semiconductor element.

FIG. 18 is a side view of an example of distortion of a silicon carbide semiconductor element. Distortion includes the distortion 220 on the front surface side, distortion 221 on a rear surface side, and distortion 222 in a cut surface side. Among these, the distortion 220 on the front surface side and the distortion 221 on the rear surface side may be identified visually or by automatic visual inspection equipment, etc., enabling a silicon carbide semiconductor element having the distortion 220 on the front surface side and/or the distortion 221 on the rear surface side to be identified as defective before shipping.

Figure 19:
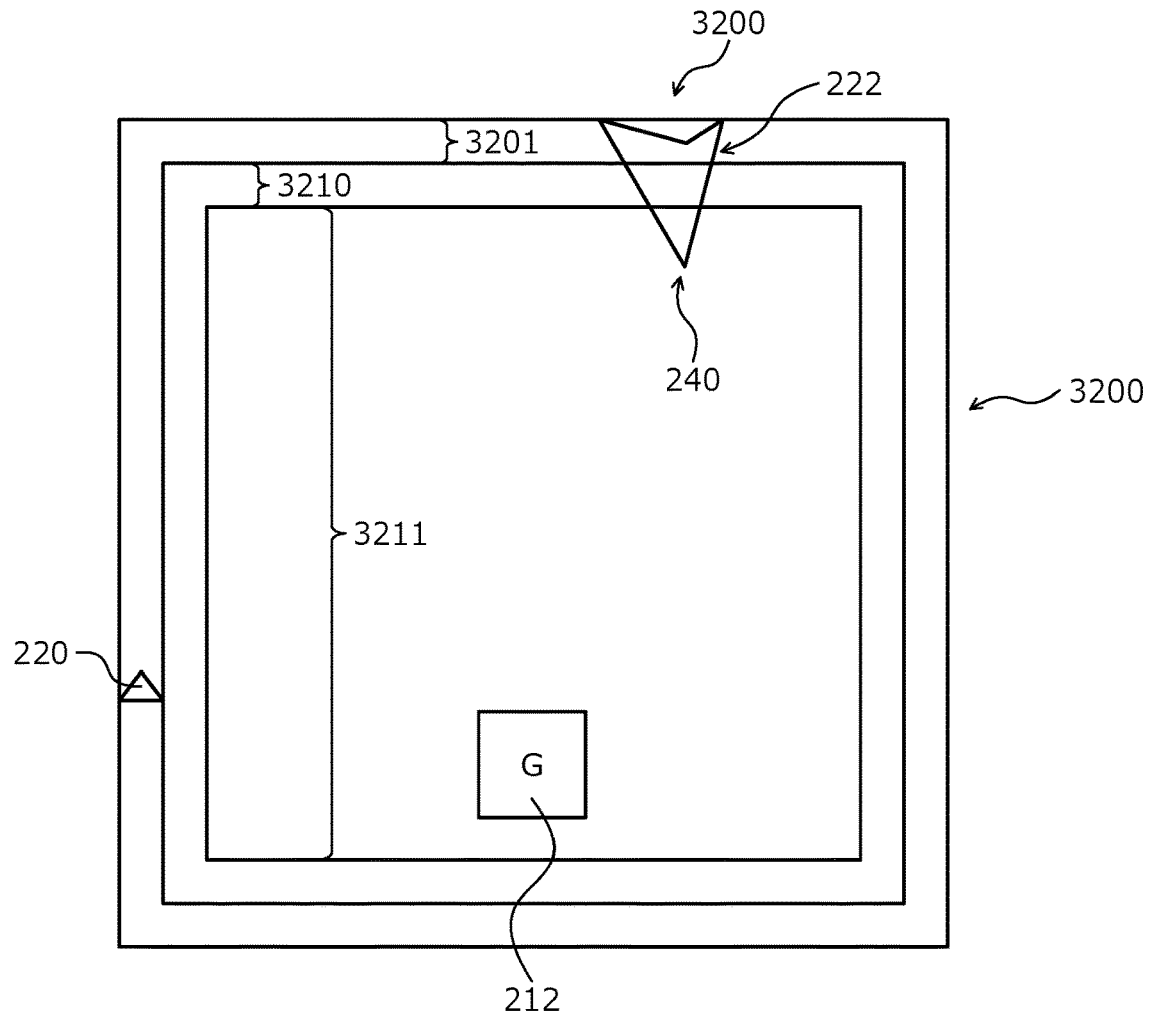
FIG. 19 is a top view of an example of enlarged distortion of the silicon carbide semiconductor element.

Nonetheless, the distortion 222 in a cut surface side in an inward direction of a cut surface is difficult to identify visually or by automatic visual inspection equipment, etc. Further, the distortion 222 in a cut surface side is often present in the inactive region 3201 and therefore, at the start of use, rarely significantly affects characteristics of the silicon carbide semiconductor device and thus, detection in a general electrical test or even in a characteristics test is difficult. However, when a silicon carbide semiconductor device having the distortion 222 in a cut surface side is used long-term and stress such as thermal stress of an implant pin is applied to the distortion 222 in a cut surface side, the distortion 222 in a cut surface side grows as an axis and reaches the edge termination region 3210 and the active region 3211. FIG. 19 is a top view of an example of enlarged distortion of the silicon carbide semiconductor element. As depicted in FIG. 19, the distortion 222 in a cut surface side is enlarged by thermal stress, becoming distortion 240 at the cut surface. A region having the distortion 240 at the cut surface has high electrical resistance and therefore, with long-term use, electrical characteristics of the silicon carbide semiconductor device degrade in general.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

Figure 1:
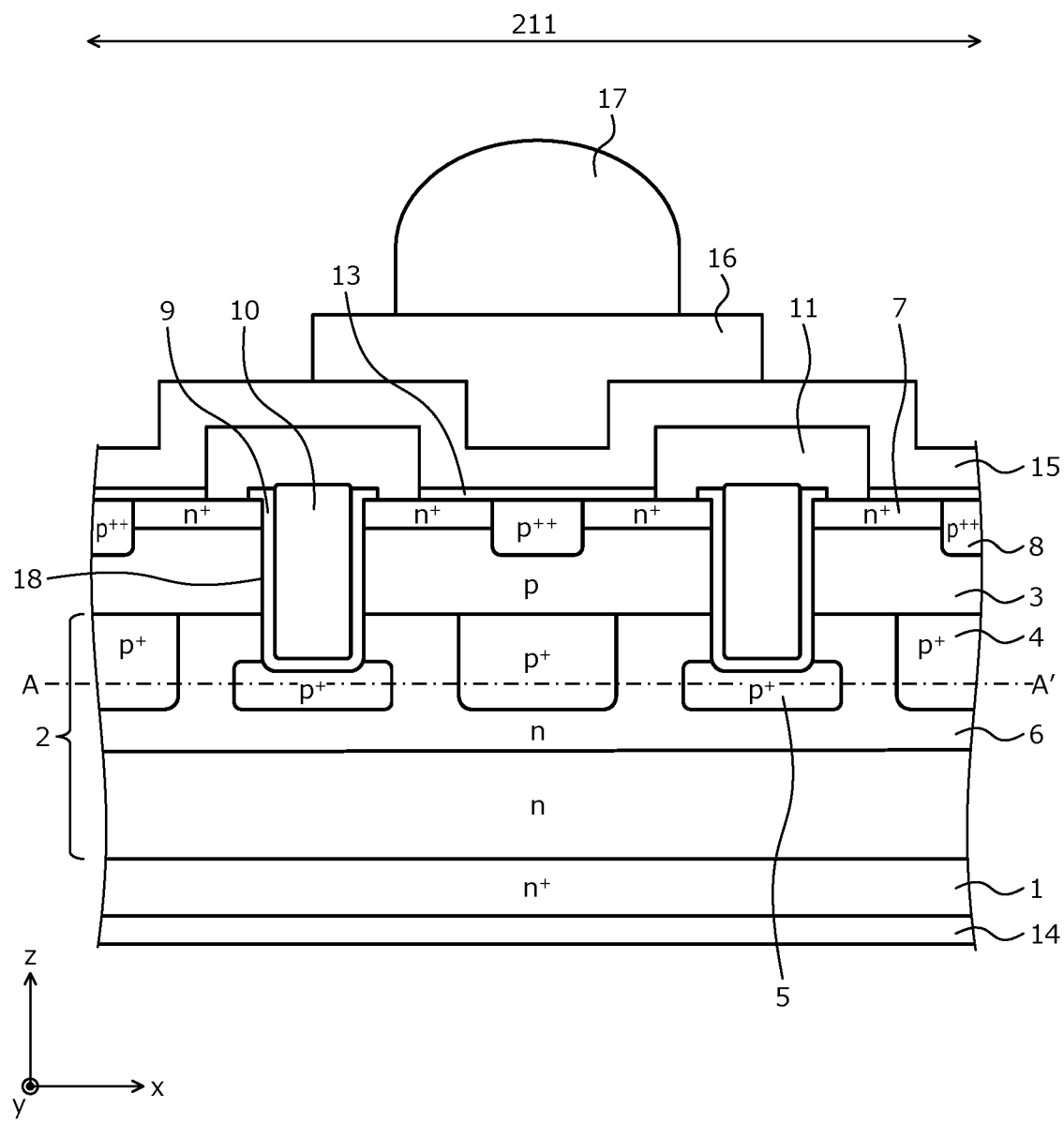
FIG. 1 is a cross-sectional view of a structure of an active region of a silicon carbide semiconductor device according to an embodiment.
Figure 2:
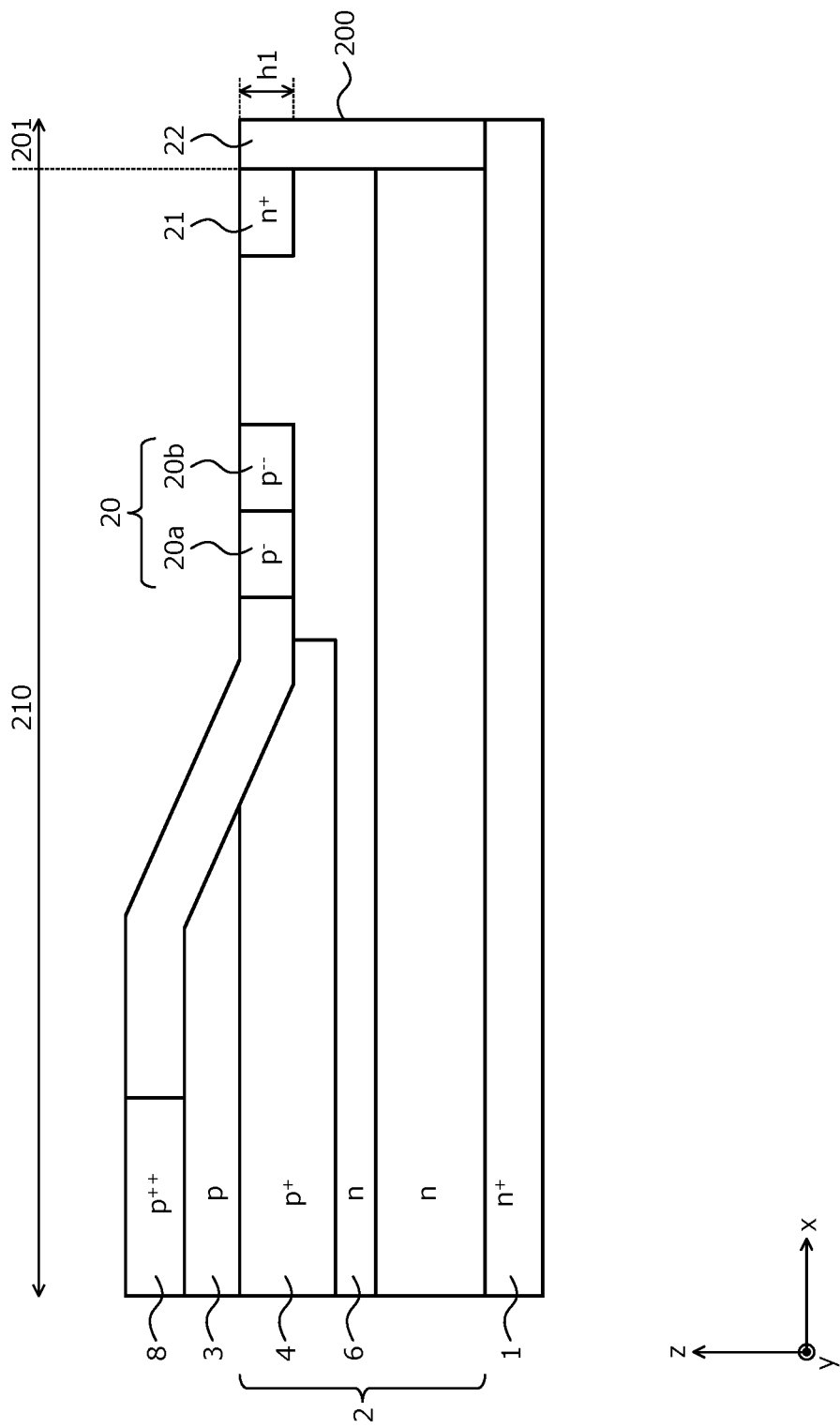
FIG. 2 is a cross-sectional view of a structure of an edge termination region and an inactive region of the silicon carbide semiconductor device according to the embodiment.

A semiconductor device according to an embodiment of the present invention is formed using a wide bandgap semiconductor material. In the embodiment, a silicon carbide semiconductor device fabricated using, for example, silicon carbide (SiC) as the wide bandgap semiconductor material will be described taking a MOSFET as an example. FIG. 1 is a cross-sectional view of a structure of an active region of the silicon carbide semiconductor device according to the embodiment. FIG. 2 is a cross-sectional view of a structure of an edge termination region and an inactive region of the silicon carbide semiconductor device according to the embodiment.

FIG. 1 depicts a configuration of an active region 211 in which an element structure is formed and in which a main current flows along a direction of substrate thickness during an ON state. FIG. 2 depicts a configuration of an edge termination region 210 that surrounds a periphery of the active region and sustains breakdown voltage and a configuration of an inactive region 201 outside the edge termination region 210.

As depicted in FIG. 1, in the silicon carbide semiconductor device according to the embodiment, on a first main surface (front surface), for example, a (0001) plane (Si face), of an n$^+$-type silicon carbide substrate (semiconductor substrate of a first conductivity type) 1, an n-type silicon carbide epitaxial layer 2 is deposited.

The n$^+$-type silicon carbide substrate 1 is a silicon carbide single crystal substrate doped with, for example, nitrogen (N). The n-type silicon carbide epitaxial layer 2 has an impurity concentration lower than an impurity concentration of the n$^+$-type silicon carbide substrate 1 and, for example, is a low-concentration n-type drift layer doped with nitrogen. At a surface of the n-type silicon carbide epitaxial layer 2, on a first side of the n-type silicon carbide epitaxial layer 2, opposite a second side of the n-type silicon carbide epitaxial layer 2 facing toward the n$^+$-type silicon carbide substrate 1, an n-type high-concentration region 6 is formed. The n-type high-concentration region 6 has an impurity concentration lower than the impurity concentration of the n$^+$-type silicon carbide substrate 1 and higher than the impurity concentration of the n-type silicon carbide epitaxial layer 2 and, for example, the n-type high-concentration region 6 is a high-concentration n-type drift layer doped with nitrogen. Hereinafter, the n$^+$-type silicon carbide substrate 1, the n-type silicon carbide epitaxial layer 2, and a p-type silicon carbide epitaxial layer 3 described hereinafter are collectively regarded as a silicon carbide semiconductor base.

As depicted in FIG. 1, on a second main surface (rear surface, i.e., rear surface of the silicon carbide semiconductor base) of the n$^+$-type silicon carbide substrate 1, a rear electrode 14 is provided. The rear electrode 14 constitutes a drain electrode. At a surface of the rear electrode 14, a drain electrode pad (not depicted) is provided.

At a first main surface side (side having the p-type silicon carbide epitaxial layer 3) of the silicon carbide semiconductor base, a trench structure is formed. In particular, a trench 18 penetrates the p-type silicon carbide epitaxial layer 3, from a surface thereof on a first side (the first main surface side of the silicon carbide semiconductor base) of the p-type silicon carbide epitaxial layer 3, opposite a second side of the p-type silicon carbide epitaxial layer 3 facing toward the n$^+$-type silicon carbide substrate 1. The trench 18 reaches the n-type silicon carbide epitaxial layer 2. Along an inner wall of the trench 18, a gate insulating film 9 is formed on a bottom and side walls of the trench 18. On the gate insulating film 9 in the trench 18, a gate electrode 10 is formed. The gate electrode 10 is insulated from the n-type silicon carbide epitaxial layer 2 and the p-type silicon carbide epitaxial layer 3 by the gate insulating film 9. The gate electrode 10 may partially protrude from a top (side toward a source electrode pad 15) of the trench 18, toward the source electrode pad 15.

In a surface layer on the first side (the first main surface side of the silicon carbide semiconductor base) of the n-type silicon carbide epitaxial layer 2, a first p$^+$-type base region 4 and a second p$^+$-type base region 5 are selectively provided. The second p$^+$-type base region 5 is formed below each trench 18, and a width of the second p$^+$-type base region 5 is wider than a width of the trench 18. The first p$^+$-type base region 4 and the second p$^+$-type base region 5 are doped with, for example, aluminum (Al).

Figure 3:
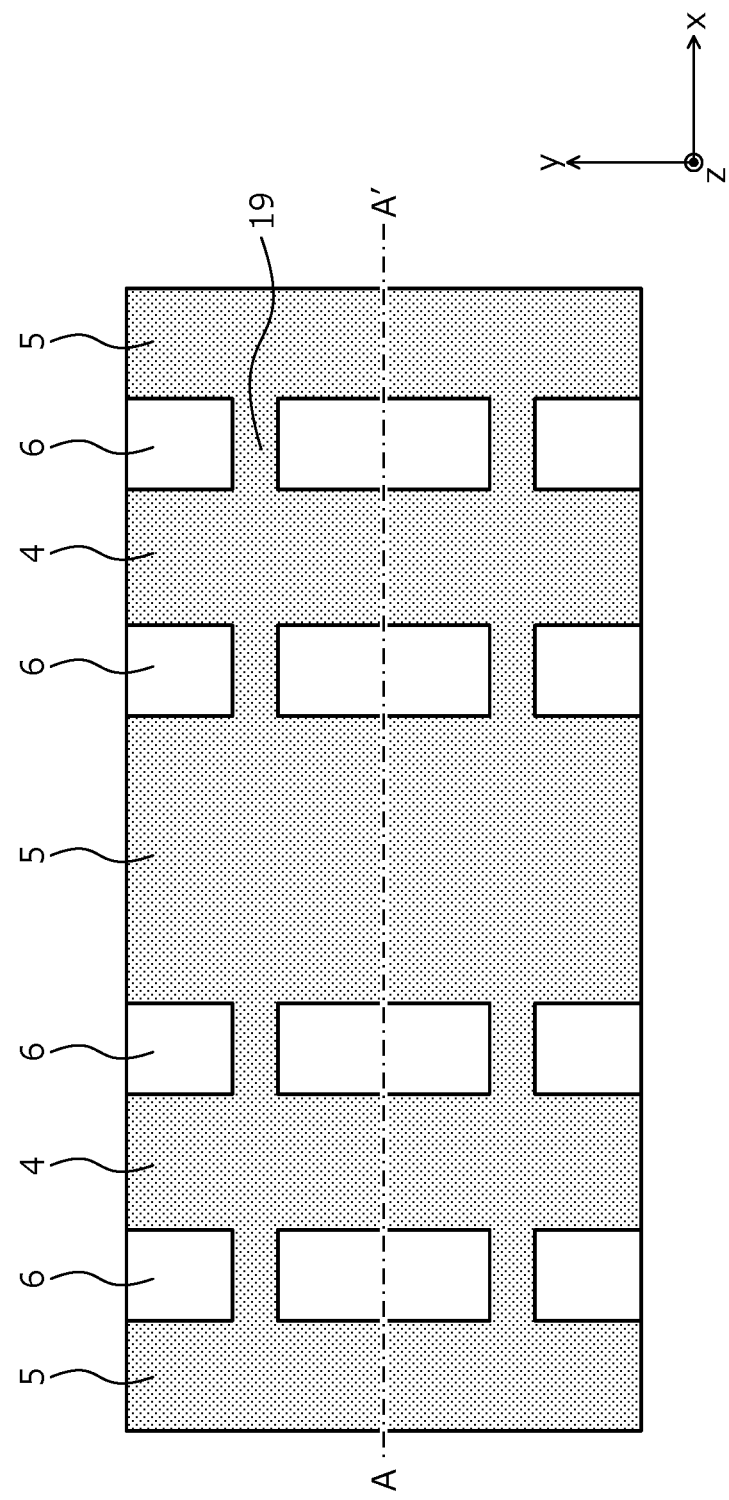
FIG. 3 is a plan view of a part of the silicon carbide semiconductor device according to the embodiment along cutting line A-A' in FIG. 1.

The first p$^+$-type base region 4 may partially extend toward the trench 18 to have a structure continuous with the second p$^+$-type base region 5. In this case, extended parts of the first p$^+$-type base region 4 may have a planar layout in which in the extended parts are alternately disposed with the n-type high-concentration region 6 along a direction (hereinafter, a second direction) y orthogonal to a direction (hereinafter, a first direction) x along which the first p$^+$-type base region 4 and the second p$^+$-type base region 5 are alternately disposed. An example of a planar layout of the first and the second p$^+$-type base regions 4, 5 is depicted in FIG. 3. FIG. 3 is a plan view of a part of the silicon carbide semiconductor device according to the embodiment along cutting line A-A' in FIG. 1.

FIG. 3 depicts a state in which the first and the second p$^+$-type base regions 4, 5 are connected by parts 19 of the first p$^+$-type base region 4 (hatched area). For example, as depicted in FIG. 3, a structure in which each of the parts 19 of the first p$^+$-type base region 4 extends toward the trenches 18 adjacent thereto along the first direction x, to be continuous with a part of the second p$^+$-type base region 5 may be periodically disposed along the second direction y. A reason for this is that holes generated when avalanche breakdown occurs at a junction part of the second p$^+$-type base region 5 and the n-type silicon carbide epitaxial layer 2 are efficiently migrated to source electrodes 13, whereby load on the gate insulating film 9 is reduced, improving reliability.

On the first side of the n-type silicon carbide epitaxial layer 2, the p-type silicon carbide epitaxial layer 3 is provided. In the p-type silicon carbide epitaxial layer 3, at the first side thereof, an n$^+$-type source region 7 and a p$^{++}$-type contact region 8 are selectively provided. The n$^+$-type source region 7 is in contact with the trench 18. Further, the n$^+$-type source region 7 and the p$^{++}$-type contact region 8 are in contact with each other. Further, in a region of the n-type silicon carbide epitaxial layer 2 between the first p$^+$-type base region 4 and the second p$^+$-type base region 5 of the surface layer on the first main side of the silicon carbide semiconductor base and in a region of the n-type silicon carbide epitaxial layer 2 between the p-type silicon carbide epitaxial layer 3 and the second p$^+$-type base region 5, the n-type high-concentration region 6 is provided.

In FIG. 1, while only two trench MOS structures are depicted, further MOS gate (insulated gates constituted by a metal oxide film semiconductor) structures having a trench structure may be disposed in parallel.

An interlayer insulating film 11 is provided on the first main surface side of the silicon carbide semiconductor base entirely so as to cover the gate electrodes 10 embedded in the trenches 18. The source electrodes 13 are in contact with the n$^+$-type source regions 7 and the p$^{++}$-type contact regions 8, via contact holes opened in the interlayer insulating film 11. The source electrodes 13 are electrically insulated from the gate electrodes 10 by the interlayer insulating film 11. On the source electrodes 13, the source electrode pad 15 is provided. Between the source electrodes 13 and the interlayer insulating film 11, for example, a barrier metal (not depicted) that prevents diffusion of metal atoms from the source electrodes 13 toward the gate electrode 10 may be provided.

On top of the source electrode pad 15, a plating film 16 is selectively provided and at a surface side of the plating film 16, solder 17 is selectively provided. In the solder 17, a pin-shaped electrode (not depicted) that is outlet wiring member that leads out potential of the source electrodes 13 is provided. The pin-shaped electrode has a needle-like shape and is joined to the source electrode pad 15 in an upright state.

Next, the edge termination region 210 and the inactive region 201 will be described. In the edge termination region 210, the p-type silicon carbide epitaxial layer 3 is selectively removed, forming at a front surface of the silicon carbide semiconductor base, a recess where the edge termination region 210 is lower than the active region 211 (recessed toward the drain electrode), and the n-type high-concentration region 6 is exposed at a bottom of the recess. Further, in the edge termination region 210, to improve breakdown voltage of a high-voltage semiconductor device overall by mitigating or distributing electric field, as a junction termination extension (JTE) structure, a first JTE region 20$a$ and a second JTE region 20$b$ are disposed adjacently.

The inactive region 201 is a region where a silicon carbide semiconductor wafer 110 is cut at the time of singulation, and a singulation cut surface 200 formed when singulation is performed appears at a side surface of the singulated silicon carbide semiconductor device. Further, the inactive region 201 is outside the edge termination region 210, and a damaged region 22 that becomes exposed at the singulation cut surface 200 is provided.

Figure 4:
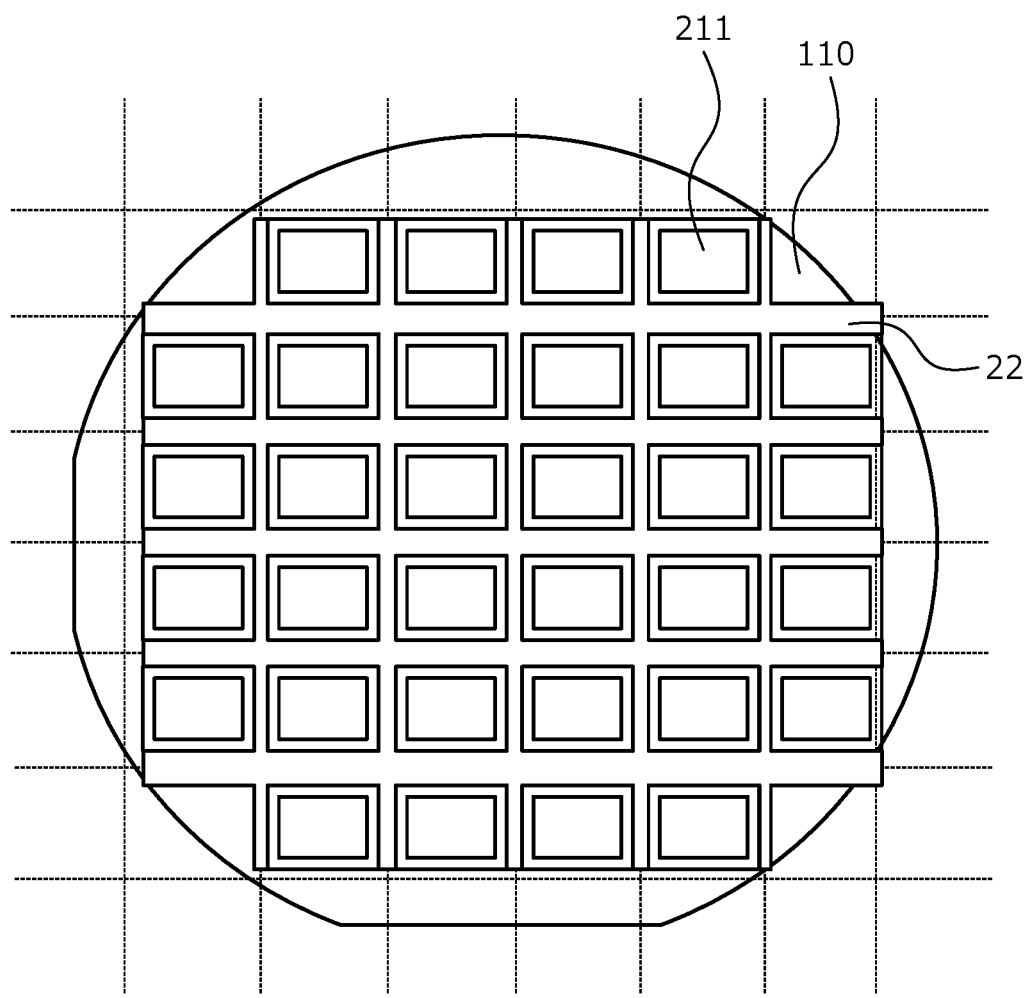
FIG. 4 is a top view of a silicon carbide semiconductor wafer before the silicon carbide semiconductor device according to the embodiment is cut from the silicon carbide semiconductor wafer.

FIG. 4 is a top view of the silicon carbide semiconductor wafer before the silicon carbide semiconductor device according to the embodiment is cut from the silicon carbide semiconductor wafer. As depicted in FIG. 4, the damaged region 22 is provided at a position where a dicing blade or the like cuts, when the silicon carbide semiconductor device is cut from the silicon carbide semiconductor wafer 110.

The damaged region 22 is a region in which a silicon carbide semiconductor material is damaged by ion implantation or laser, impairing crystallinity, and more specifically, is a layer in which crystal defects are formed to a greater extent than in other regions. Since the damaged region 22 is a damaged layer having a hardness lower than that of other regions, at the time of dicing, the blade easily enters, dicing along the damaged region 22, whereby cutting of the silicon carbide semiconductor wafer 110 is facilitated, enabling an occurrence of distortion during the dicing to be suppressed.

The damaged region 22 is formed by, for example, ion implantation. In this case, the damaged region 22 may have, for example, an impurity concentration higher than that of a region of high concentration provided in the active region 211 such as the n$^+$-type source region 7 and that of the p$^{++}$-type contact region 8. The greater is the amount of impurity, the greater is the damage by ion implantation and therefore, the greater is the extent that cutting of the silicon carbide semiconductor wafer 110 is facilitated. In particular, the impurity concentration may be in a range from $1\times10^{19}$/cm$^3$ to $1\times10^{20}$/cm$^3$.

An ion species implanted in the damaged region 22 may be a p-type dopant (p-type impurity) or an n-type dopant (n-type impurity). Therefore, the damaged region 22 may be a p-type or may be an n-type. Further, both a p-type dopant and an n-type dopant may be implanted. In this case, the above impurity concentration is a sum of the p-type impurity concentration and the n-type impurity concentration. When the damaged region 22 is a p-type, design is such that a depletion layer does not reach the damaged region 22. For example, the edge termination region 210 is increased in length so that the depletion layer does not reach the damaged region 22.

Further, in the damaged region 22, a density of crystal defects needs not be uniform. In this case, the density of crystal defects may be higher with proximity to a surface of the damaged region 22, the surface on a first side of the damaged region 22, opposite a second side of the damaged region 22 facing toward the n$^+$-type silicon carbide substrate 1. For example, a density of crystal defects in a region from the surface of the damaged region 22 on the first side of the damaged region 22 to a depth h1 from the surface of the damaged region 22 is set to be higher than that of other regions. At the time of dicing, the blade is inserted from the surface and therefore, the higher is the density of crystal defects of the region that the blade first enters, the easier is the cutting of the silicon carbide semiconductor wafer 110.

Further, the damaged region 22 may have a super junction (SJ) structure in which a p-type region and an n-type region are joined. In this case, in the SJ structure, the p-type region and the n-type region may be joined along a vertical direction (direction z), or the p-type region and the n-type region may be joined along a horizontal direction (the first direction x). Further, in FIG. 2, while the damaged region 22 is in contact with an n$^+$-type semiconductor region 21 and the n$^+$-type silicon carbide substrate 1, the damaged region 22 needs not be in contact therewith.

A method of manufacturing a silicon carbide semiconductor device according to the embodiment will be described. FIGS. 5, 6, 7, 8, 9, 10, 11, 12, 13, and 14 are cross-sectional views of the silicon carbide semiconductor device according to the embodiment during manufacture.

Figure 5:
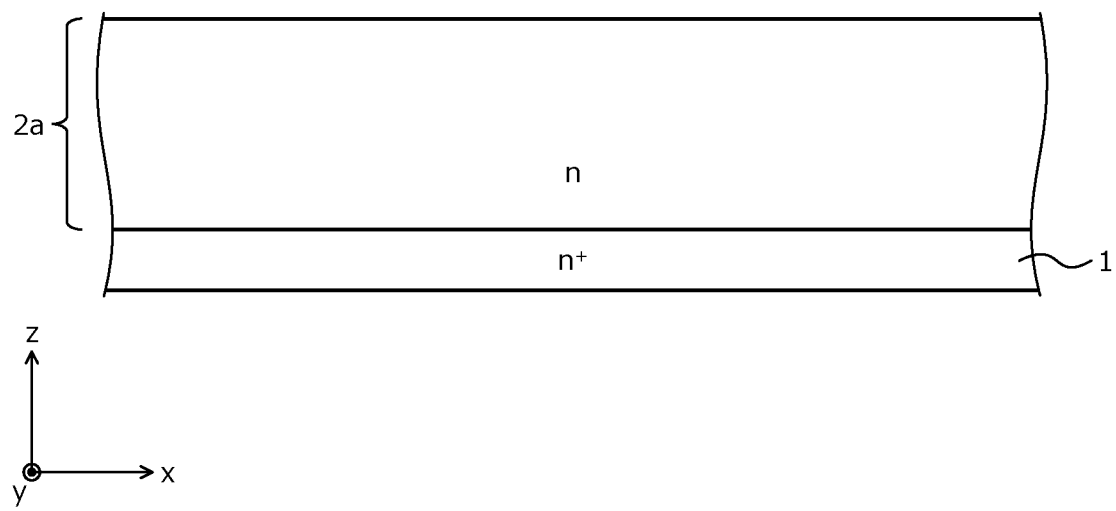
FIG. 5 is a cross-sectional view of the silicon carbide semiconductor device according to the embodiment during manufacture.

First, the n$^+$-type silicon carbide substrate 1 made of an n-type silicon carbide is prepared. Subsequently, on the first main surface of the n$^+$-type silicon carbide substrate 1, a first n-type silicon carbide epitaxial layer 2a made of silicon carbide is formed by epitaxial growth to have a thickness of, for example, about 30 μm, while an n-type impurity, for example, nitrogen atoms is doped. The first n-type silicon carbide epitaxial layer 2a constitutes the n-type silicon carbide epitaxial layer 2. The state up to here is depicted in FIG. 5.

Figure 6:
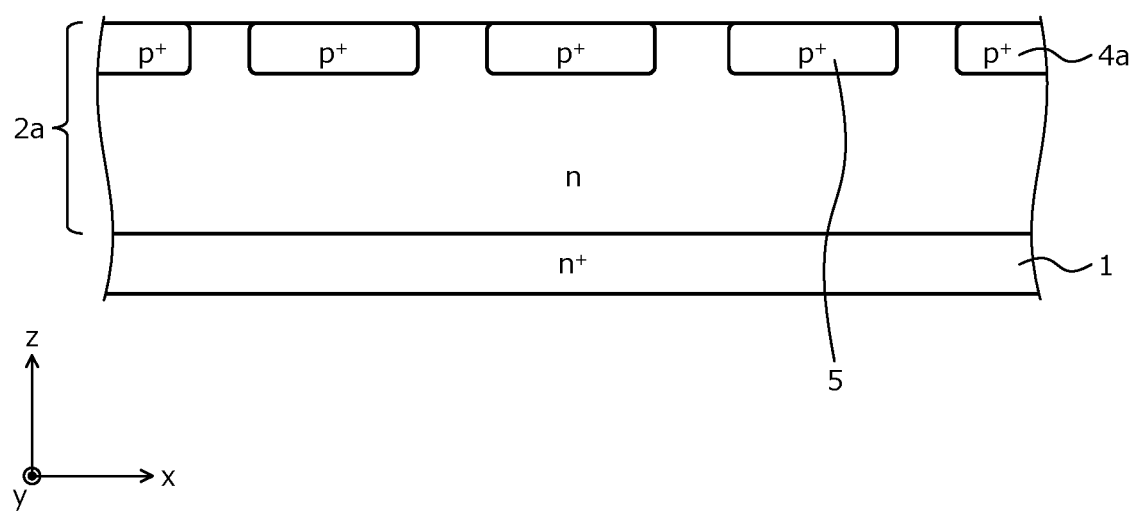
FIG. 6 is a cross-sectional view of the silicon carbide semiconductor device according to the embodiment during manufacture.

Next, on a surface of the first n-type silicon carbide epitaxial layer 2a, by a photolithographic technique, an ion implantation mask having predetermined openings is formed using, for example, an oxide film. Subsequently, a p-type impurity such as aluminum is implanted in the openings of the oxide film, forming at a depth of about 0.5 μm, lower first $p^+$-type base regions 4a. Concurrently with the lower first $p^+$-type base regions 4a, the second $p^+$-type base regions 5 constituting the bottoms of the trenches 18 may be formed. Configuration is such that a distance between the lower first $p^+$-type base region 4a and the second $p^+$-type base region 5 that are adjacent to each other is about 1.5 μm. An impurity concentration of the lower first $p^+$-type base region 4a and of the second $p^+$-type base region 5 is set to be, for example, about $5\times10^{18}/cm^3$. The state up to here is depicted in FIG. 6.

Next, the ion implantation mask is partially removed, an n-type impurity such as nitrogen is ion implanted in the openings, forming in some surface regions of the first n-type silicon carbide epitaxial layer 2a, for example, at a depth of about 0.5 μm, a lower n-type high-concentration region 6a. An impurity concentration of the lower n-type high-concentration regions 6a is set to be, for example, about $1\times10^{17}/cm^3$.

On the surface of the first n-type silicon carbide epitaxial layer 2a, a second n-type silicon carbide epitaxial layer 2b doped with an n-type impurity such as nitrogen is formed to have a thickness of about 0.5 μm. An impurity concentration of the second n-type silicon carbide epitaxial layer 2b is set to be about $3\times10^{15}/cm^3$. Hereinafter, the first n-type silicon carbide epitaxial layer 2a and the second n-type silicon carbide epitaxial layer 2b combined constitute the n-type silicon carbide epitaxial layer 2.

Next, on a surface of the second n-type silicon carbide epitaxial layer 2b, by photolithography, an ion implantation mask having predetermined openings is formed using, for example, an oxide film. Subsequently, a p-type impurity such as aluminum is implanted in the openings of the oxide film, forming at a depth of about 0.5 μm, upper first $p^+$-type base regions 4b superimposed on the lower first $p^+$-type base regions 4a. The lower first $p^+$-type base regions 4a and the upper first $p^+$-type base regions 4b form continuous regions to constitute the first $p^+$-type base regions 4. An impurity concentration of the upper first $p^+$-type base regions 4b is set to be, for example, about $5\times10^{18}/cm^3$.

Figure 7:
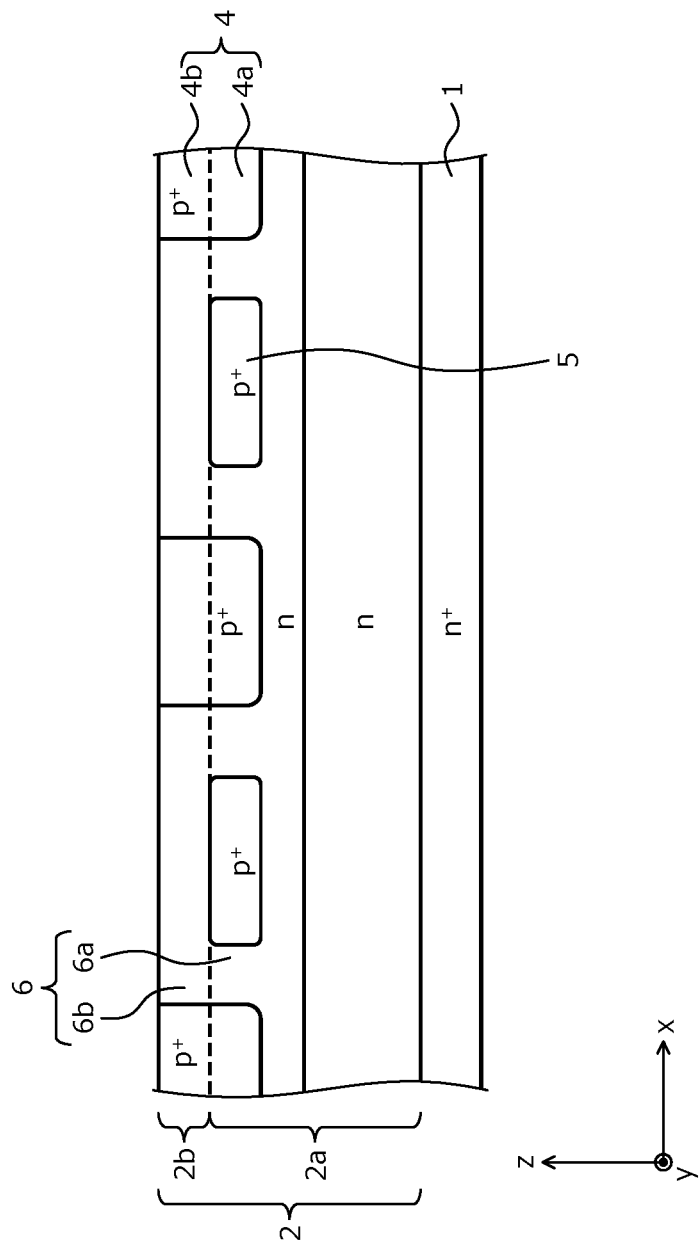
FIG. 7 is a cross-sectional view of the silicon carbide semiconductor device according to the embodiment during manufacture.

Next, the ion implantation mask is partially removed, an n-type impurity such as nitrogen is ion implanted in the openings, forming at a depth of, for example, about 0.5 μm in some surface regions of the second n-type silicon carbide epitaxial layer 2b, an upper n-type high-concentration region 6b. An impurity concentration of the upper n-type high-concentration regions 6b is set to be, for example, about $1\times10^{17}/cm^3$. The upper n-type high-concentration regions 6b and the lower n-type high-concentration regions 6a are formed to at least partially contact each other and form the n-type high-concentration regions 6. However, the n-type high-concentration region 6 may be formed on the entire substrate surface, or may be omitted. The state up to here is depicted in FIG. 7.

Figure 8:
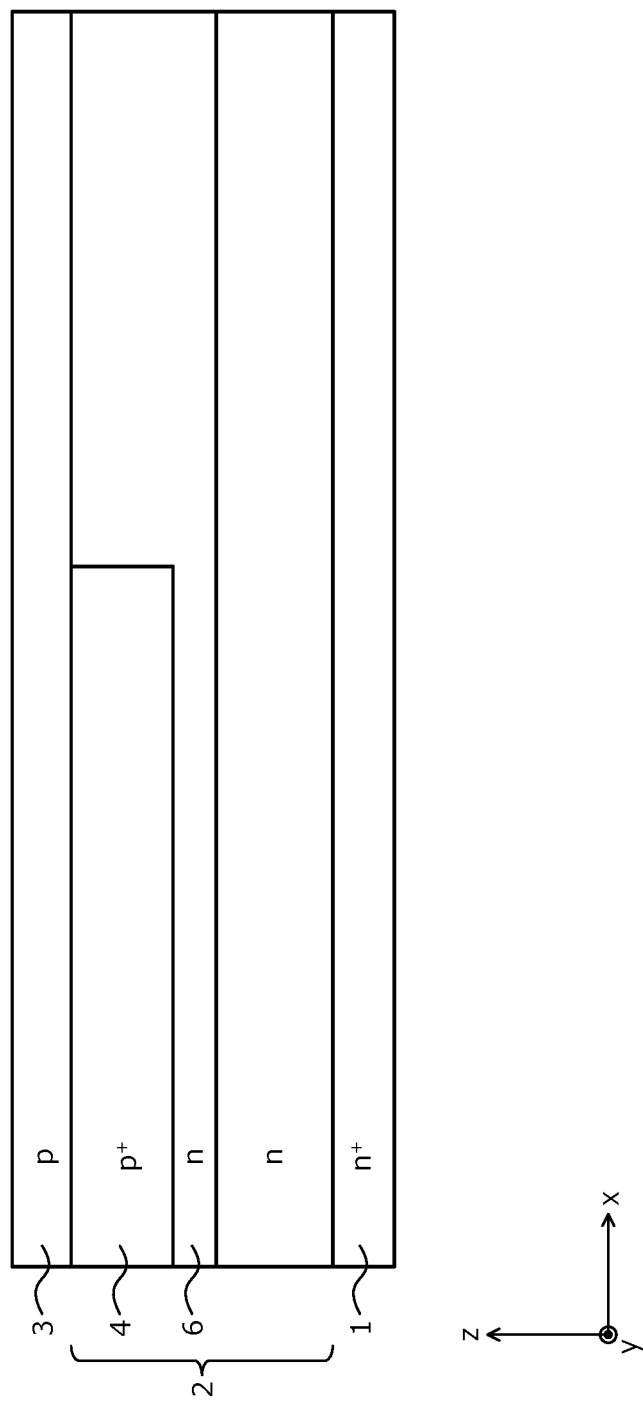
FIG. 8 is a cross-sectional view of the silicon carbide semiconductor device according to the embodiment during manufacture.

Next, on the surface of the n-type silicon carbide epitaxial layer 2, the p-type silicon carbide epitaxial layer 3 doped with a p-type impurity such as aluminum is formed to have a thickness of about 1.3 μm. An impurity concentration of the p-type silicon carbide epitaxial layer 3 is set to be about $4\times10^{17}/cm^3$. The state up to here is depicted in FIG. 8. FIG. 8 depicts the edge termination region 210 of silicon carbide semiconductor device.

Figure 9:
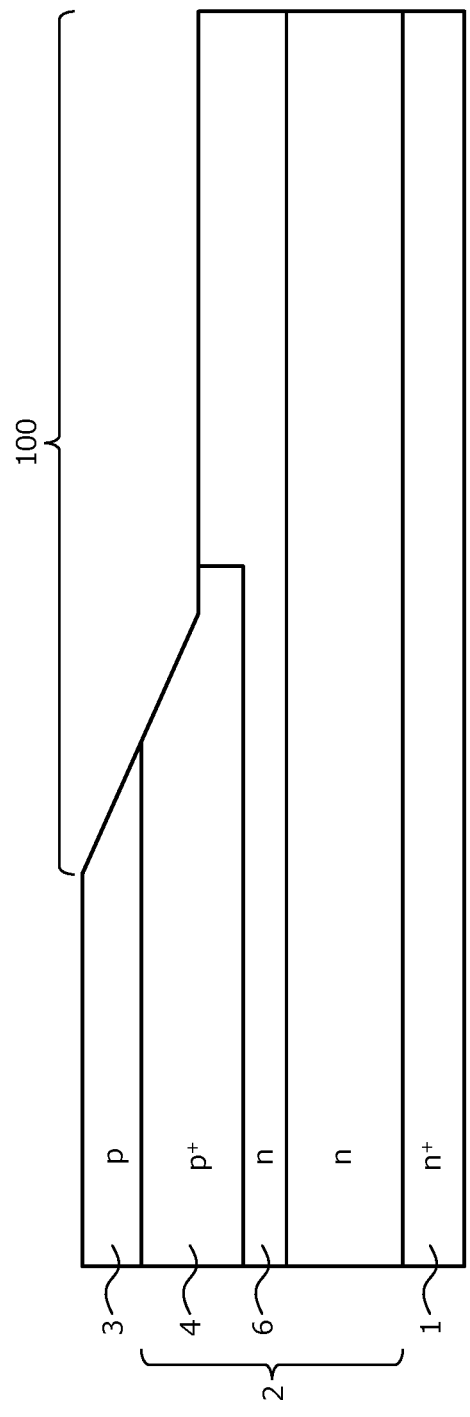
FIG. 9 is a cross-sectional view of the silicon carbide semiconductor device according to the embodiment during manufacture.

Next, on the p-type silicon carbide epitaxial layer 3, by photolithography, a photoresist is formed at an element center part, the photoresist is used as a mask, and dry etching using a fluorine-based gas such as sulfur hexafluoride ($SF_6$) is performed, removing a periphery of the p-type silicon carbide epitaxial layer 3 to a depth of about 1.3 μm and creating a recess 100 of a single step. At a bottom of a side surface of the recess 100, the first $p^+$-type base region 4 formed in the n-type silicon carbide epitaxial layer 2 is exposed, and a central part of a bottom of the recess 100 is formed to be substantially parallel to the $n^+$-type silicon carbide substrate 1. The state up to here is depicted in FIG. 9. FIG. 9 depicts the edge termination region 210 of silicon carbide semiconductor device.

Figure 10:
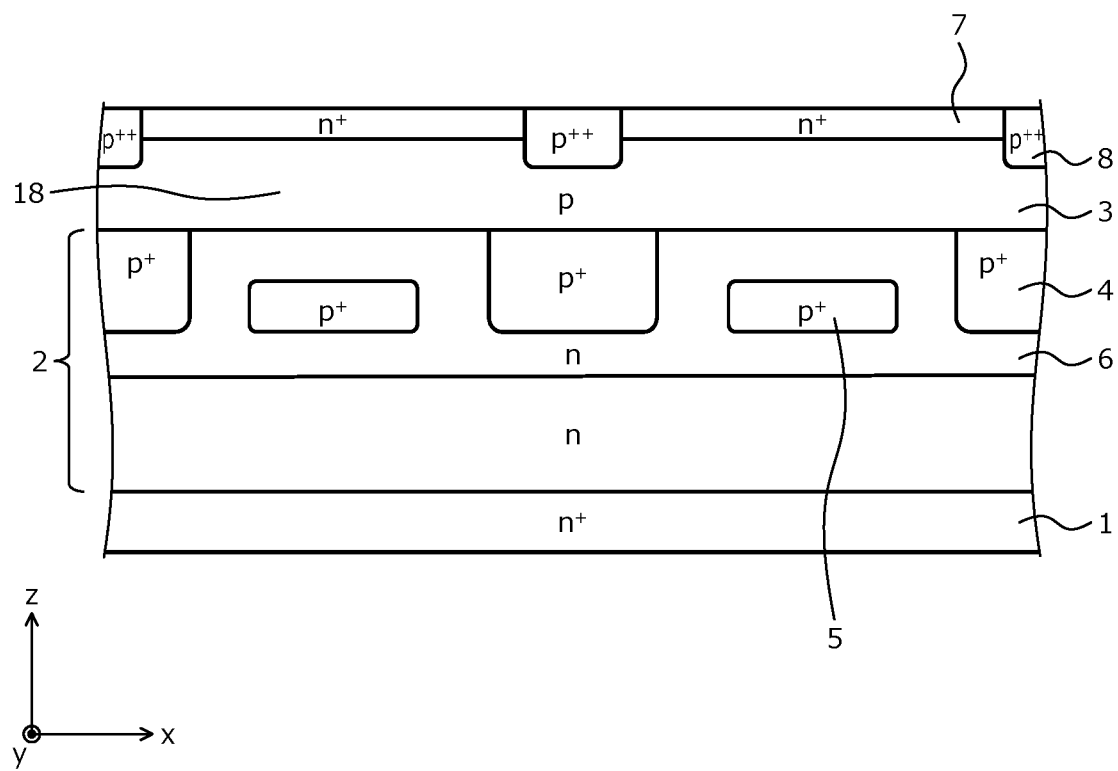
FIG. 10 is a cross-sectional view of the silicon carbide semiconductor device according to the embodiment during manufacture.

Next, on the surface of the p-type silicon carbide epitaxial layer 3 and the surface of the exposed n-type silicon carbide epitaxial layer 2, an ion implantation mask having predetermined openings is formed by photolithography using, for example, an oxide film. An n-type impurity such as phosphorus (P) is ion implanted in the openings, forming the $n^+$-type source region 7 at parts of the surface of the p-type silicon carbide epitaxial layer 3. An impurity concentration of the $n^+$-type source regions 7 is set to be higher than the impurity concentration of the p-type silicon carbide epitaxial layer 3. Next, the ion implantation mask used in the formation of the $n^+$-type source regions 7 is removed and by a similar method, an ion implantation mask having predetermined openings is formed, a p-type impurity such as aluminum is ion implanted in parts of the surface of the p-type silicon carbide epitaxial layer 3, forming the $p^{++}$-type contact regions 8. An impurity concentration of the $p^{++}$-type contact regions 8 is set to be higher than the impurity concentration of the p-type silicon carbide epitaxial layer 3. The state up to here is depicted in FIG. 10.

Figure 11:
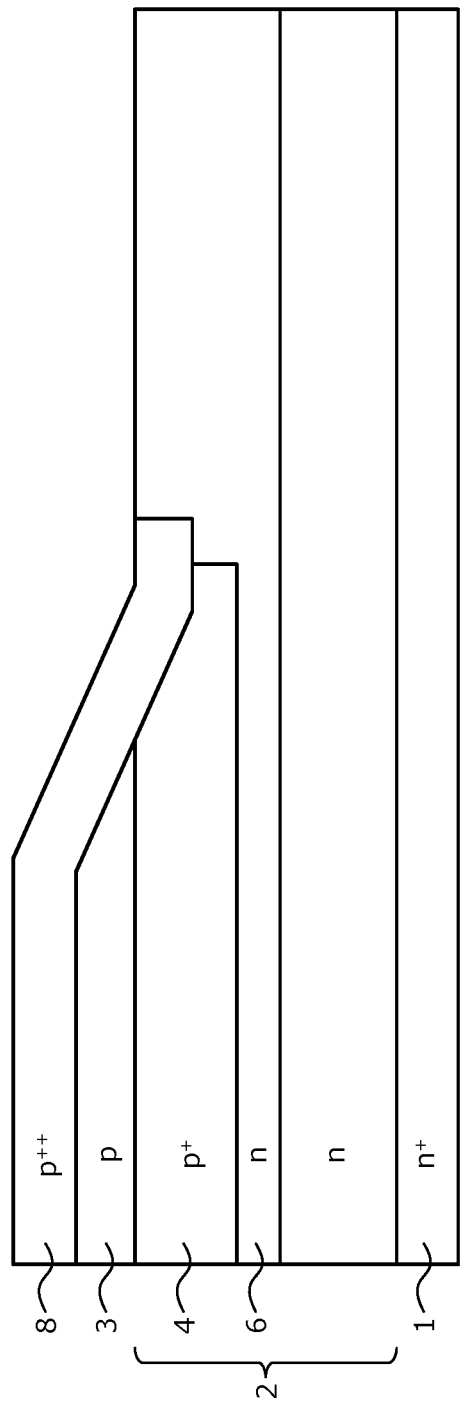
FIG. 11 is a cross-sectional view of the silicon carbide semiconductor device according to the embodiment during manufacture.

Further, as depicted in FIG. 11, a region ion implanted concurrently with the $p^{++}$-type contact regions 8 may be formed on the active region, on the surface of the n-type silicon carbide epitaxial layer 2 and covering the first $p^+$-type base region 4.

Next, on the surface of the p-type silicon carbide epitaxial layer 3 and the surface of the exposed n-type silicon carbide epitaxial layer 2, an oxide film having a thickness of 1.5 μm is deposited and, by photolithography, an ion implantation mask having predetermined openings is formed using, for example, the oxide film. A p-type impurity such as aluminum is ion implanted in the openings, forming in the surface of the exposed n-type silicon carbide epitaxial layer 2, a JTE region 20 having a low impurity concentration. By a similar method, an ion implantation mask having a predetermined opening is formed using, for example, an oxide film, an n-type impurity is ion implanted in a part of the surface of the n-type silicon carbide epitaxial layer 2, forming the $n^+$-type semiconductor region 21.

Next, heat treatment (annealing) in an inert gas atmosphere of 1700 degrees C. is performed, whereby activation processing of the first $p^+$-type base regions 4, the second $p^+$-type base regions 5, the $n^+$-type source regions 7, and the $p^{++}$-type contact regions 8 is performed. As described, ion implanted regions may be collectively activated by one session of heat treatment, or the heat treatment and activation may be performed each time ion implantation is performed.

Figure 12:
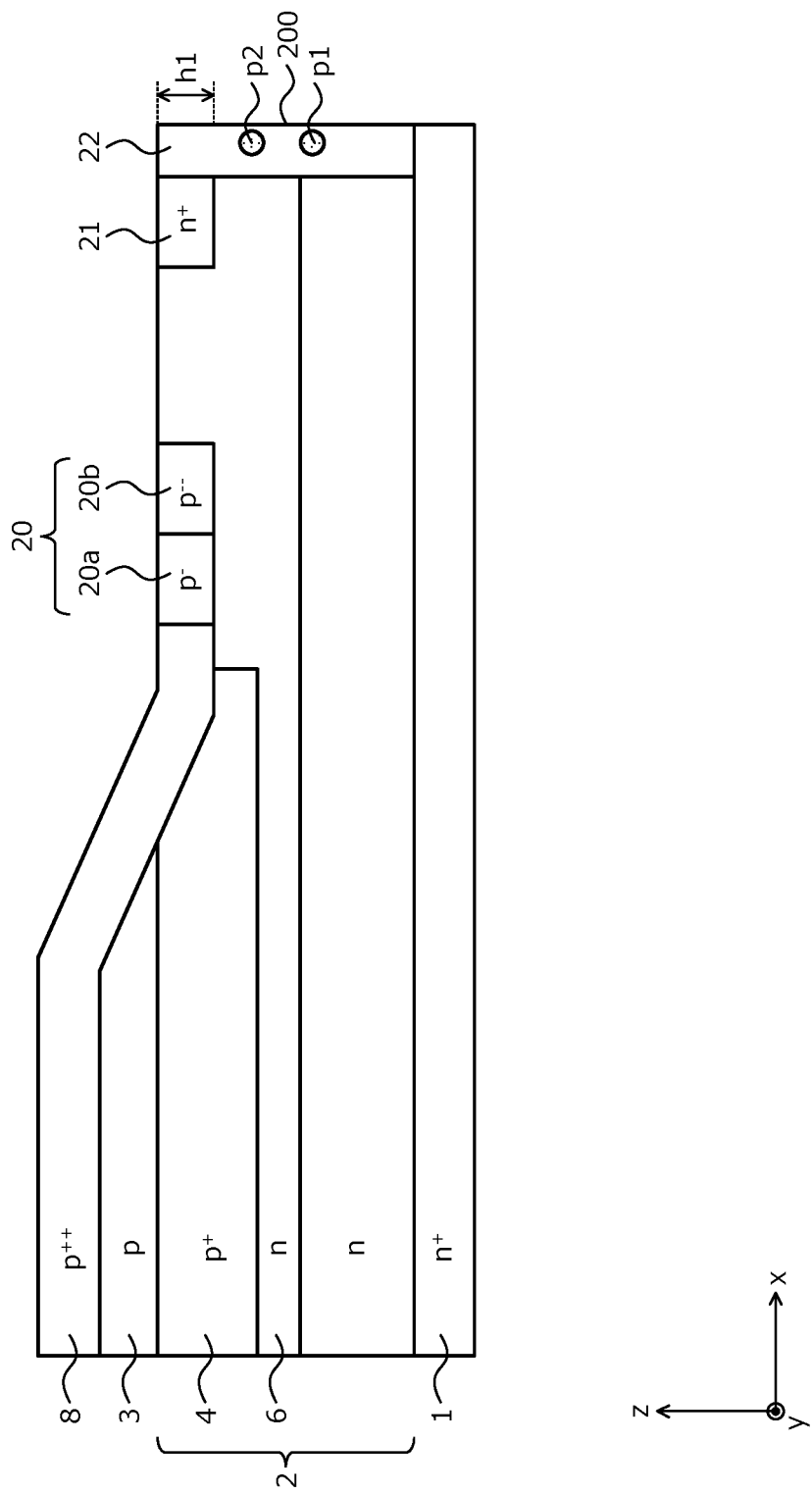
FIG. 12 is a cross-sectional view of the silicon carbide semiconductor device according to the embodiment during manufacture.

Next, by photolithography, an ion implantation mask having predetermined openings is formed using, for example, an oxide film, an n-type or a p-type impurity is ion implanted in parts of the surface of the n-type silicon carbide epitaxial layer 2, forming the damaged regions 22. Further, the damaged regions 22 may be formed by combining the ion implantation for forming the $n^+$-type source regions 7 and the ion implantation for forming the $p^{++}$-type contact regions 8, whereby a semiconductor region having an impurity concentration higher than an impurity concentration of a semiconductor region in the active region 211 may be formed. The state up to here is depicted in FIG. 12. Further, the JTE region 20 may be structured to be formed in a region outside an element, from an end of the first $p^+$-type base region 4, or as depicted in FIG. 12, may be structured to be formed outside an element, from the side surface of the recess 100.

Further, the damaged region 22 may be formed by laser irradiation. In this case, a focal point of the laser may be a point p2 that is closer to the first side of the n-type silicon carbide epitaxial layer 2 than is an intermediate point p1 of the n-type silicon carbide epitaxial layer 2, whereby a density of crystal defects of a region near the first side of the n-type silicon carbide epitaxial layer 2 may be increased.

The damaged region 22 may be formed by implanting helium (He) or protons (p). Further, the damaged region 22 may be formed by a combination of ion implantation and laser irradiation.

Figure 13:
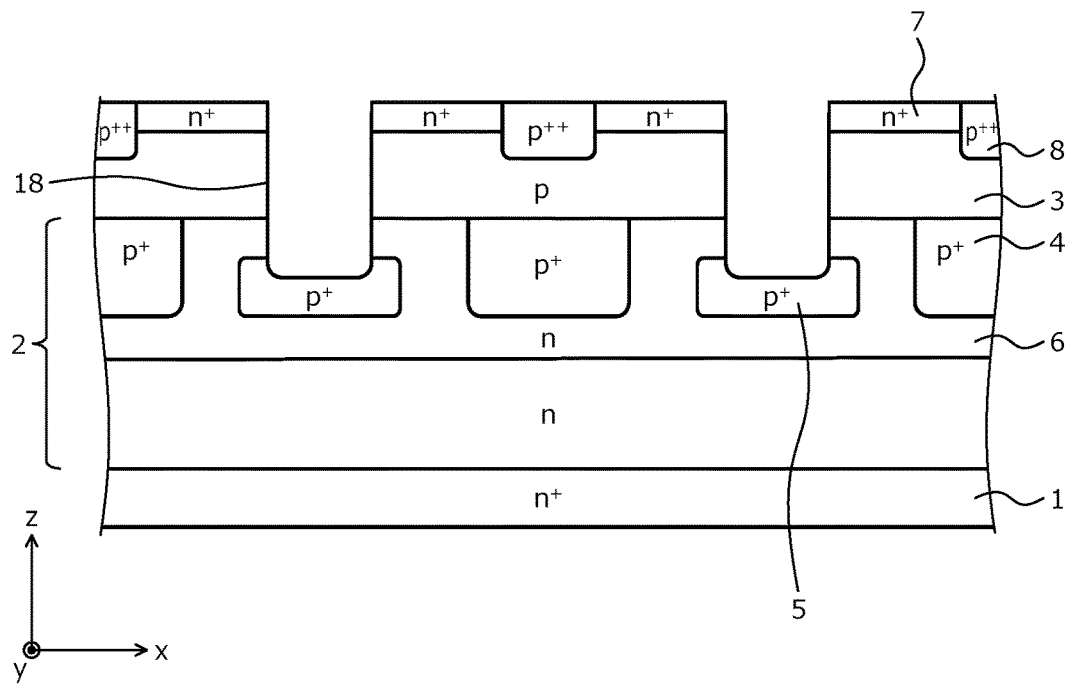
FIG. 13 is a cross-sectional view of the silicon carbide semiconductor device according to the embodiment during manufacture.

Next, on the surface of the p-type silicon carbide epitaxial layer 3, by photolithography, a mask having predetermined openings and for forming the trenches 18 is formed using, for example, an oxide film. Next, by dry etching, the trenches 18 are formed penetrating the p-type silicon carbide epitaxial layer 3 and reaching the n-type silicon carbide epitaxial layer 2. The bottoms of the trenches 18 may reach the first $p^+$-type base regions 4 formed in the n-type silicon carbide epitaxial layer 2. Next, the mask for forming the trenches 18 is removed. The state up to here is depicted in FIG. 13.

Next, along the surfaces of the $n^+$-type source regions 7 and the $p^{++}$-type contact regions 8, and the bottoms and the side walls of the trenches 18, the gate insulating film 9 is formed. The gate insulating film 9 may be formed by thermal oxidation by heat treatment at a temperature of about 1000 degrees C. in an oxygen atmosphere. Further, the gate insulating film 9 may be formed by a method of deposition by a chemical reaction such as that for a high temperature oxide (HTO).

Next, on the gate insulating film 9, a polycrystalline silicon layer doped with, for example, phosphorus atoms, is formed. The polycrystalline silicon layer may be formed so as to be embedded in the trenches 18. The polycrystalline silicon layer is patterned by photolithography so as to remain in the trenches 18, whereby the gate electrodes 10 are formed. The gate electrodes 10 may partially protrude out of the trenches 18.

Figure 14:
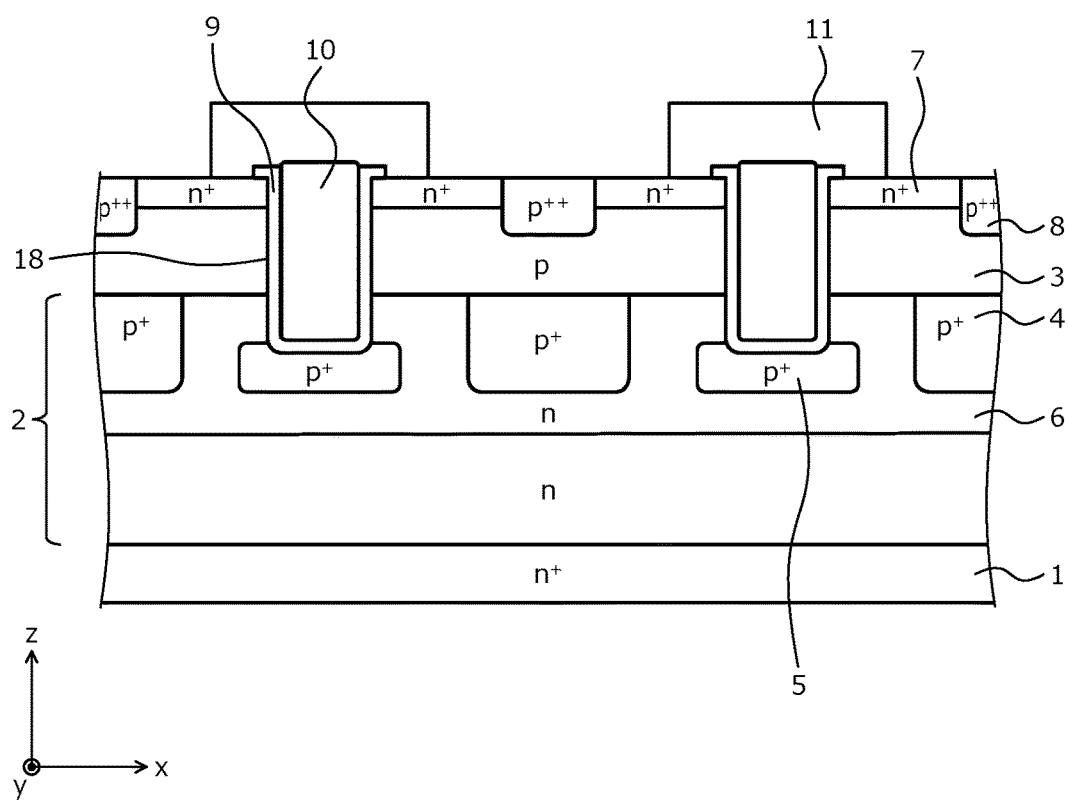
FIG. 14 is a cross-sectional view of the silicon carbide semiconductor device according to the embodiment during manufacture.

Next, for example, phosphorus glass is deposited so as to cover the gate insulating film 9 and the gate electrodes 10 and have a thickness of about 1 µm, whereby the interlayer insulating film 11 is formed. Next, a barrier metal (not depicted) containing titanium (Ti) or titanium nitride (TiN) may be provided so as to cover the interlayer insulating film 11. The interlayer insulating film 11 and the gate insulating film 9 are patterned by photolithography, whereby contact holes exposing the $n^+$-type source regions 7 and the $p^{++}$-type contact regions 8 are formed. Thereafter, heat treatment (reflow) is performed, planarizing the interlayer insulating film 11. The state up to here is depicted in FIG. 14.

Next, in the contact holes and on the interlayer insulating film 11, a conductive film of nickel (Ni), etc., constituting the source electrodes 13 is formed. The conductive film is patterned by photolithography so that the source electrodes 13 remain only in the contact holes.

Next, on the second main surface of the $n^+$-type silicon carbide substrate 1, the rear electrode 14 containing nickel, etc., is provided. Thereafter, heat treatment is performed in an inert gas atmosphere of about 1000 degrees C., forming the source electrodes 13 and the rear electrode 14 that form ohmic junctions with the $n^+$-type source regions 7, the $p^{++}$-type contact regions 8 and the $n^+$-type silicon carbide substrate 1.

Next, on the first main surface of the $n^+$-type silicon carbide substrate 1, by a sputtering method, an aluminum film having a thickness of about 5 µm is deposited and by photolithography, the aluminum film is removed so that the source electrodes 13 and the interlayer insulating film 11 are covered, whereby the source electrode pad 15 is formed.

Next, on a surface of the rear electrode 14, for example, titanium (Ti), nickel and gold (Au) are sequentially stacked in order state, whereby the drain electrode pad (not depicted) is formed. Next, on a top of the source electrodes 13, the plating film 16 is selectively formed, and the pin-shaped electrode (not depicted) is formed on the plating film 16, via the solder 17. As described, the semiconductor device depicted in FIGS. 1 and 2 is completed.

Figure 15:
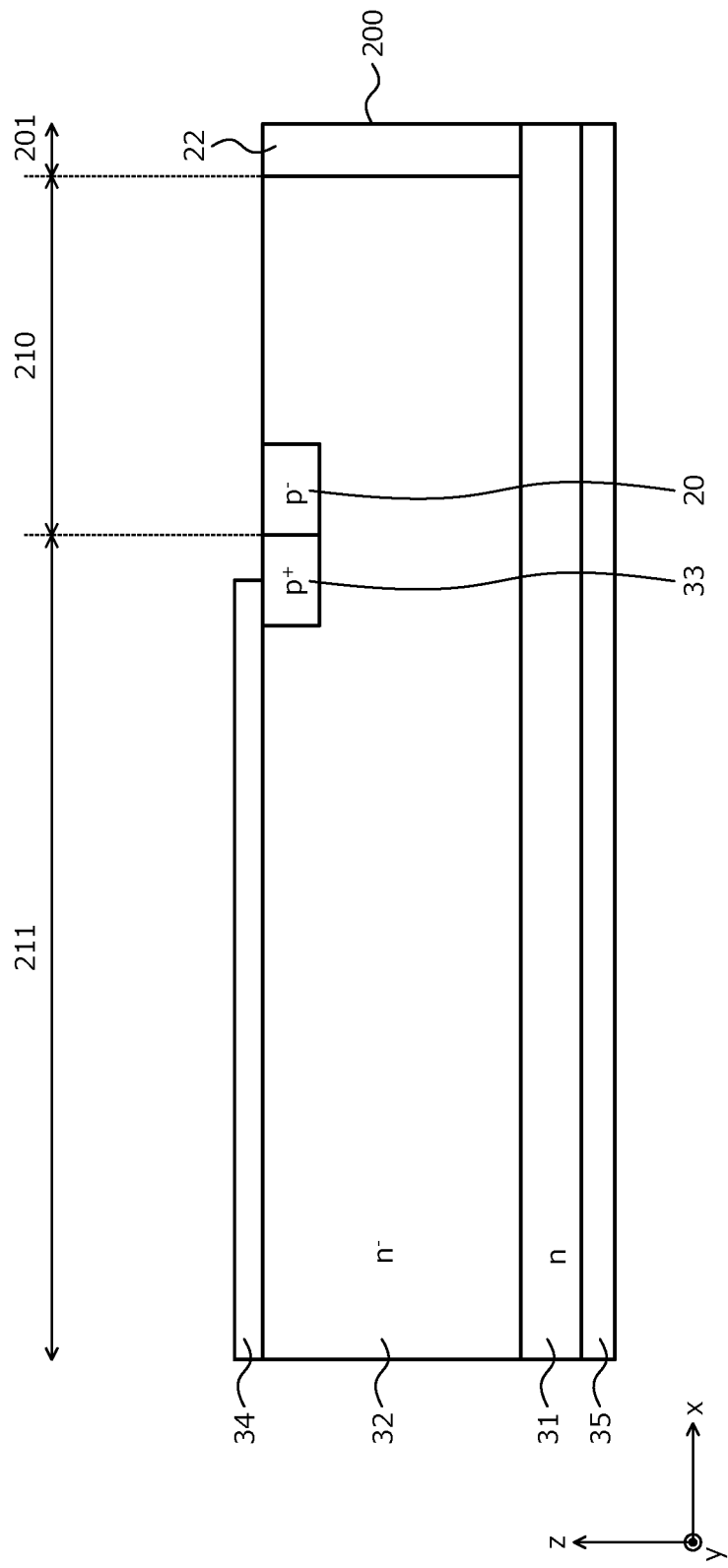
FIG. 15 is a cross-sectional view of another structure of the silicon carbide semiconductor device according to an embodiment.
Figure 16:
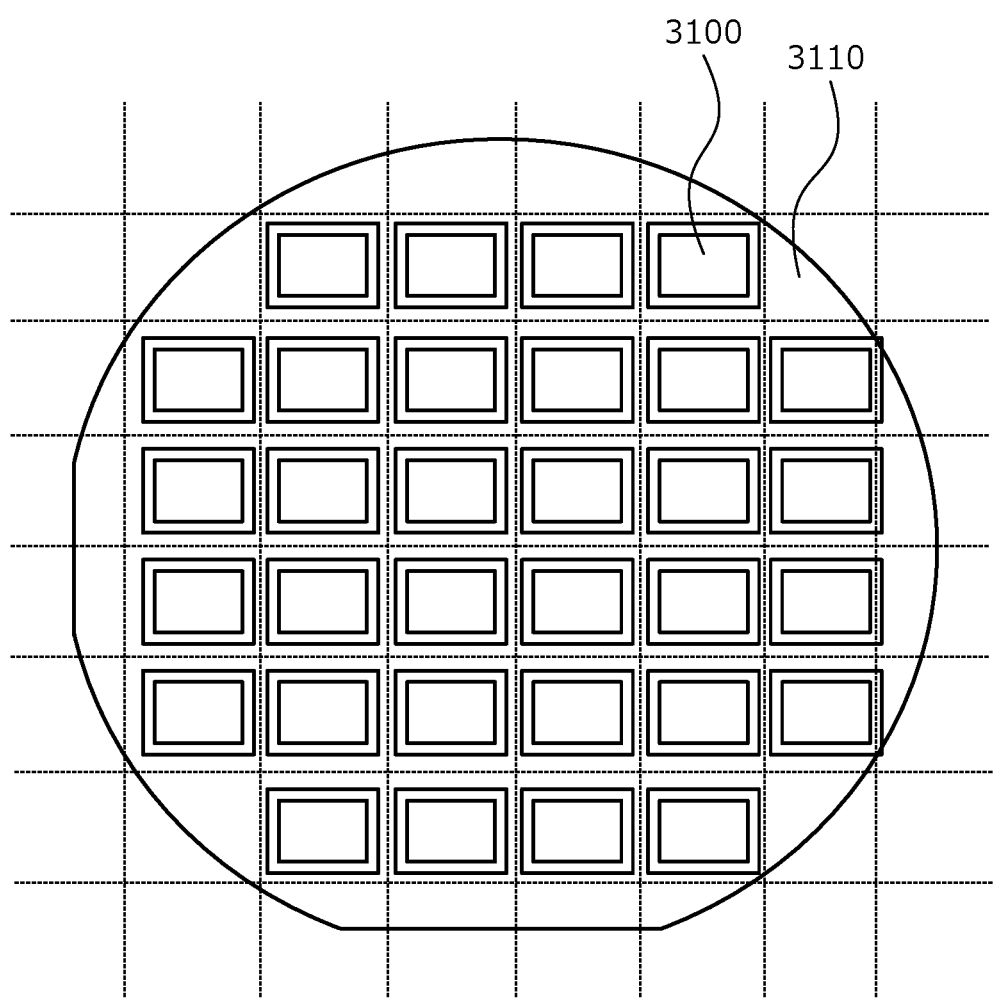
FIG. 16 is a top view of silicon carbide semiconductor elements on a silicon carbide semiconductor wafer.

While a MOSFET has been described herein, the present invention is applicable to other silicon carbide semiconductor devices. FIG. 15 is a cross-sectional view of another structure of the silicon carbide semiconductor device according to an embodiment. Here, as another example of the silicon carbide semiconductor device, a Schottky barrier diode (SBD) will be described.

As depicted in FIG. 15, in a SBD according to an embodiment, on a first main surface (front surface), for example, a (0001) plane (Si face) of an n-type silicon carbide substrate 31, an $n^-$-type drift layer 32 is deposited. In the active region 211, in a surface layer of the $n^-$-type drift layer 32, on a first side (base front surface side) of the $n^-$-type drift layer 32, opposite a second side of the $n^-$-type drift layer 32 facing toward the n-type silicon carbide substrate 31, one $p^+$-type guard ring region 33 having a circular shape surrounding the active region 211 is disposed.

Further, in the edge termination region 210, in the surface layer of the $n^-$-type drift layer 32 on the first side (base front surface side) of the $n^-$-type drift layer 32, the JTE region 20 of a $p^-$-type is selectively provided to improve breakdown voltage of a high-voltage semiconductor device overall by mitigating or distributing electric field of the edge termination region 210. The JTE region 20 is provided so as to surround the $p^+$-type guard ring region 33.

In the inactive region 201, the damaged region 22 that becomes exposed at the singulation cut surface 200 is provided. The damaged region 22, similarly in the case of the MOSFET, is a region in which the silicon carbide semiconductor material is damaged by ion implantation and/or laser.

In the active region 211 toward a front surface of the $n^-$-type drift layer 32, a Schottky electrode 34 forming a Schottky contact with the $n^-$-type drift layer 32 is provided. Further, at a rear surface of the n-type silicon carbide substrate 31, a lower electrode 35 is provided.

Even with the SBD, similarly in the case of the MOSFET, by dicing along the damaged region 22, cutting of the silicon carbide semiconductor wafer 110 is facilitated, enabling suppression of the occurrence of distortion during dicing.

As described, according to the silicon carbide semiconductor device of the embodiment, a damaged region in which the silicon carbide semiconductor material is damaged is provided in the inactive region. The damaged region is formed to have more crystal defects than other regions and thus, has a lower hardness. Therefore, at the time of dicing, the blade enters easily, and dicing is performed along the damaged region, whereby cutting of the silicon carbide semiconductor wafer is facilitated, enabling suppression of the occurrence of distortion during dicing.

In the embodiments of the present invention, while a case in which a main surface of a silicon carbide substrate made of silicon carbide is a (0001) plane and on the (0001) plane, a MOS is formed has been described as an example, without limitation hereto, various modifications are possible such as in an orientation of the main surface of the wide bandgap semiconductor substrate.

Further, in the embodiments of the present invention, while the first conductivity type is assumed as an n-type and a second conductivity type is assumed as a p-type, the present invention is similarly implemented when the first conductivity type is a p-type and the second conductivity type is an n-type.

The silicon carbide semiconductor device and the method of manufacturing a silicon carbide semiconductor device according the embodiments of the present invention achieve an effect in that an occurrence of deformation in an inward direction of a cut surface is suppressed, whereby reliability does not decrease even with long-term use.

As described, the silicon carbide semiconductor device and the method of manufacturing a silicon carbide semiconductor device according to the embodiments of the present invention are useful for high-voltage semiconductor devices used in power converting equipment and in power supply devices such as in industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a silicon carbide semiconductor substrate of a first conductivity type;
   an active region in which a main current flows provided on the silicon carbide semiconductor substrate;
   a termination region disposed outside the active region and in which a voltage withstanding structure is formed; and
   a damaged region disposed outside the termination region and in which crystallinity is impaired, the damaged region being exposed at a cut surface that is formed when singulation is performed, a hardness of the damaged region being lower than that of the active region and that of the termination region.

2. The silicon carbide semiconductor device according to claim 1, wherein the damaged region is a region in which crystal defects are formed.

3. A silicon carbide semiconductor device, comprising:
   a semiconductor substrate of a first conductivity type;
   an active region, in which a main current flows provided, on the semiconductor substrate;
   a termination region disposed outside the active region and in which a voltage withstanding structure is formed;
   a damaged region disposed outside the termination region and in which crystallinity is impaired, the damaged region being exposed at a cut surface that is formed when singulation is performed, the damaged region being a region in which crystal defects are formed; and
   a semiconductor region provided in the active region, wherein the damaged region has an impurity concentration that is higher than an impurity concentration of the semiconductor region provided in the active region.

4. The silicon carbide semiconductor device according to claim 3, wherein the impurity concentration of the damaged region ranges from $1\times10^{19}/cm^3$ to $1\times10^{20}/cm^3$.

5. A silicon carbide semiconductor device, comprising:
   a semiconductor substrate of a first conductivity type;
   an active region, in which a main current flows provided, on the semiconductor substrate;
   a termination region disposed outside the active region and in which a voltage withstanding structure is formed; and
   a damaged region disposed outside the termination region and in which crystallinity is impaired, the damaged region being exposed at a cut surface that is formed when singulation is performed, the damaged region being a region in which crystal defects are formed,
   wherein the semiconductor substrate comprises an epitaxial layer; and a base substrate,
   wherein the epitaxial layer has a first side and a second side which is opposite to the first side and which is in contact with the base substrate; and
   wherein the damaged region is provided in contact with the first side in the epitaxial layer, and the damaged region has a density of crystal defects that is higher with proximity to the first side.

* * * * *